United States Patent [19]
Pohl

[11] Patent Number: 4,725,814
[45] Date of Patent: Feb. 16, 1988

[54] METHOD AND CIRCUIT FOR ANALOG TO DIGITAL CONVERSION OF A NOISY DC VOLTAGE SIGNAL

[75] Inventor: Winfried Pohl, Büttelborn, Fed. Rep. of Germany

[73] Assignee: Robert Bosch GmbH, Stuttgart, Fed. Rep. of Germany

[21] Appl. No.: 40,639

[22] Filed: Apr. 21, 1987

[30] Foreign Application Priority Data

Apr. 30, 1986 [DE] Fed. Rep. of Germany ....... 3614597

[51] Int. Cl.$^4$ ............................................. H03M 1/20
[52] U.S. Cl. ............................... 340/347 AD; 358/36
[58] Field of Search ................. 340/347 AD, 347 CC; 358/36

[56] References Cited

U.S. PATENT DOCUMENTS 4,183,016 1/1980 Sawagata ..................... 340/347 AD
4,334,237 6/1982 Reitmeier ..................... 358/36
4,621,254 11/1986 Belcher ....................... 340/347 AD

FOREIGN PATENT DOCUMENTS 0034671 3/1979 Japan ........................... 340/347 AD Primary Examiner—Charles D. Miller
Attorney, Agent, or Firm—Frishauf, Holtz, Goodman & Woodward

[57] ABSTRACT

A steady or slowing changing analog signal affected with noise is sampled and held at the sampling rate of a following analog to digital converter and has a rectangular a.c. signal superimposed on it before it is supplied to the converter. This is done in such a way that when the analog signal is in the middle range between quantization steps, the least significant bit (LSB) is well defined. When the analog signal is close to a quantization threshold, the superimposed rectangular pulses change the LSB values back and forth and comparison of successive values is used to suppress changes in LSB value. On the other hand, if the analog signal is changing more rapidly through quantization steps, the circuit does not interfere with digital output changes. The system can be used during the vertical blanking intervals of a television signal for digitizing an analog voltage corresponding to a blending voltage for a video signal.

9 Claims, 3 Drawing Figures

METHOD AND CIRCUIT FOR ANALOG TO DIGITAL CONVERSION OF A NOISY DC VOLTAGE SIGNAL

This invention concerns a method and apparatus for converting a slowly changing analog dc voltage signal which is subject to or mixed with noise or other extraneous electrical disturbances into a digital signal with a defined output value, involving the superposition onto the analog signal during the conversion period of a rectangular ac signal having an amplitude corresponding to about half of the quantization steps.

The fact is generally known that after conversion of an analog signal into digital form and back again, the result is no longer a continuously analog signal but rather a signal that can be represented only by discrete steps, the so-called quantization steps. A timewise linear change of a dc voltage in such a case produces a stepped running voltage. If now a dc voltage on which noise or other disturbances are superimposed is supplied to an analog to digital converter in which the noise or other disturbances reach the threshold value of a quantization step, it can occur that the the least significant bit (LSB) of the digital output word is continually switched one way and the other, because it cannot be decisively defined by the analog to digital converter. Even when the analog dc voltage remains constant in the neighborhood of a threshold, a permanent irregular switching back and forth of the LSB appears and higher value bits can also be switched in the case of certain digital words.

SUMMARY OF THE INVENTION

It is an object of the present invention to provide analog to digital conversion of a dc signal affected by disturbing signals such as circuit noise in which there will always be available a defined digital output value for the analog input voltage in spite of the superimposed disturbances.

Briefly, not only is there superimposed on the analog signal during the conversion period a rectangular a.c. signal with an amplitude corresponding to about half of the quantization steps, but, furthermore, during the duration of an oscillation train of the rectangular a.c. signal, three start pulses coincident in time with the flanks of the rectangular a.c. signal are supplied to the analog to digital converter. When an analog signal value in a midregion between two quantization step levels appears, an unambiguously defined value of the LSB is produced. When an analog signal value is present which is in the neighborhood of one of the two quantization steps, however, a new value of the LSB is produced following the lapse of the conversion period after one of the start pulses. The digital output word of the analog to digital converter is made available with the defined value of the LSB for further processing, whereas the digital word with a changing value of the LSB is not passed on.

The invention has the advantage that an absolutely stable digital output signal is obtained for any analog input voltage that may be present.

Preferably, the digital output word with a varying value of LSB is prevented from being stored until a digital output word of defined LSB value is provided by the analog to digital converter.

Another desirable feature of the invention is that the digital output words of the converter are separately stored on the one hand during duration of the start pulses and on the other hand after the end of the conversion cycle comprising the conversion times of the start pulses and for the duration of the start pulses, the stored present values are compared with the values after the end of the previous conversion cycle, with an evaluation of the level of the analog signal being performed only when these values agree.

When the analog signal is a blending voltage for fading of video signals into each other, it is put through a sample and hold circuit before going to the analog to digital converter and is converted only during the vertical blanking interval. When there is a quick change of the pending voltage signal, no disturbing signal evaluation of the analog signal is performed.

As for the details of circuits of the invention, those will be better understood from the illustrated description that follows.

BRIEF DESCRIPTION OF THE DRAWINGS

The invention is further described by way of illustrative example with reference to the annexed drawings, in which.

DESCRIPTION OF THE ILLUSTRATED EMBODIMENTS

Figure 1:
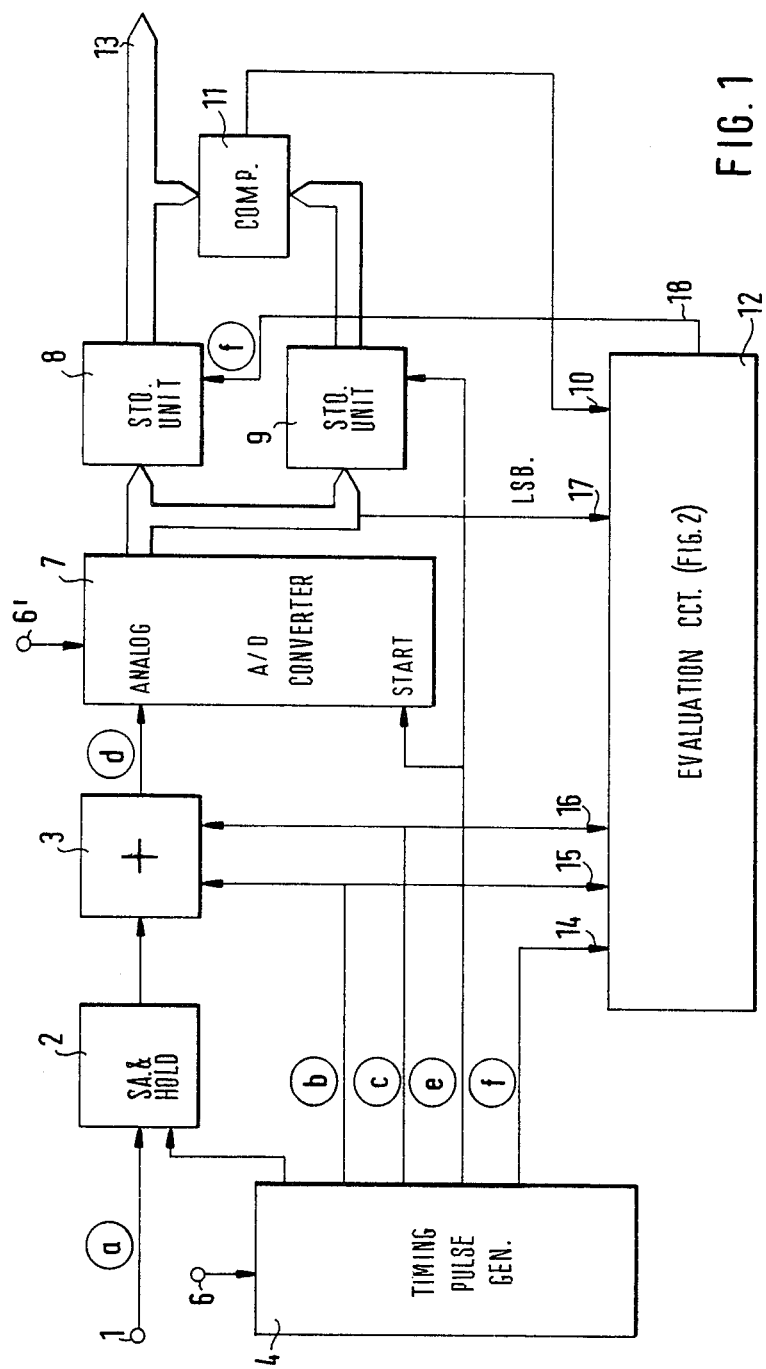
FIG. 1 is a circuit block diagram of a circuit for carrying out the method of the invention.
Figure 3:
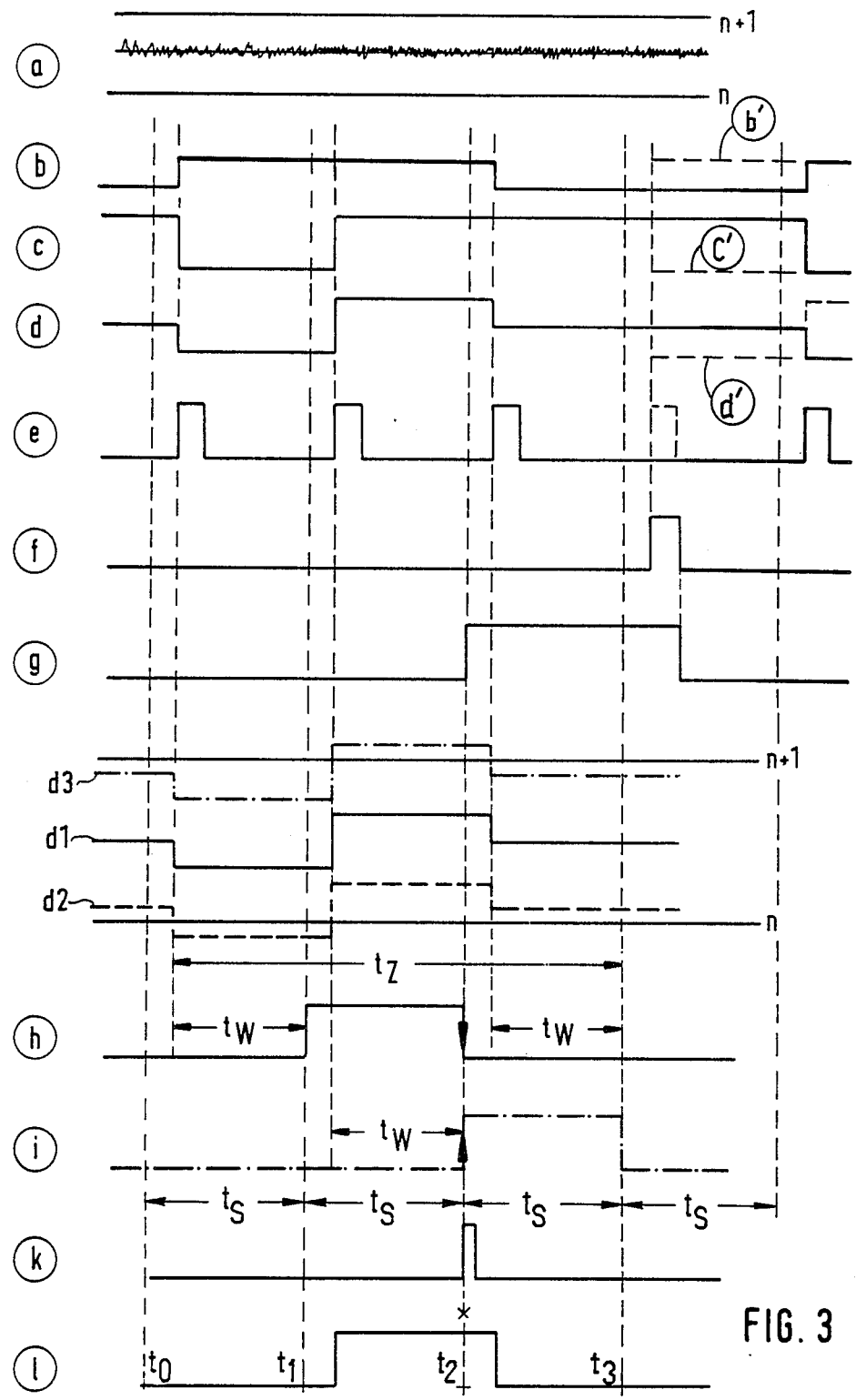
FIG. 3 is a comparison graph, to the same time scale, of different signals appearing at various places in the circuits of FIGS. 1 and 2.

At the input terminal 1 of the circuit of FIG. 1 an analog dc voltage signal (a) having superimposed noise or noiselike signals as illustrated in line (a) of FIG. 3, which is to be supplied to the sample and hold circuit 2 in which the analog signal is sampled at particular instants and stored at all other times.

The output of the circuit 2 is connected to one input of a summing amplifier 3, to the other inputs of which respective rectangular pulse signals (b) and (c) are supplied (see lines (b) and (c) of FIG. 3). These pulse signals have amplitudes such that in the summing amplifier 3 they combine to produce a rectangular alternating voltage (d) which is added to the analog signal (a) in the summing amplifier and has an amplitude from top to bottom which is considerably less than the height of a quantization step of the A/D converter 7. The pulse signals (b) and (c) and the sampling (set pulse) signal for the sample and hold circuit 2 are generated by a timing pulse generator 4 to which a clock signal is supplied from the terminal 6 which is the same as that which is supplied at the terminal 6' for clocking the analog to digital converter 7 to which the output of the summing circuit 3 is also supplied.

Three start pulses (e) (see line (e) of FIG. 3) are supplied by the timing pulse generator 4 to the start input of the analog to digital converter 7, which supplies an 8-bit parallel output to both of two 8-bit storage units 8 and 9. As shown in FIG. 3, the start pulses (e) begin at the same time as the changes in voltage of an alternating square wave cycle (d). at the beginning of these pulses and hence the transitions of the pulses (b), (c), and (d) come at a short interval after the respective sampling intervals begin at times $t_0$, $t_1$, $t_2$, and $t_3$ designated at the bottom of FIG. 3, which are clocked by the sampling pulses provided at the input 6' of the A/D converter.

The storage unit 8 is clocked with a timing pulse signal (f) and the storage unit 9 is clocked with the start pulses (e). Each pulse (f) is timed with respect to the sampling intarval ($t_s$ in the same way as the start pulses (e) and occurs in the next sampling interval after the sampling interval in which the third start pulse (e) occurs, as shown in FIG. 3. The start pulses (e) serve to start a new conversion operation in the analog to digital converter 7 and the sampling pulse at the input 6' terminates the operation by generating a new digital output. The conversion operation period is designated $t_W$ in FIG. 3. In the case illustrated in solid lines for the timing pulses (b), (c) and (d), a new wave cycle in the sampling period follows the pulse (f), but it is possible to have a new pulse wave cycle begin with the beginning of the pulse (f) as illustrated by the broken lines (b'), (c') and (d'), providing more evaluation cycles $t_Z$ (FIG. 3) for the evaluation circuit 12 (FIGS. 1 and 2) per unit of time.

The outputs of the two 8-bit storage units 8 and 9 are connected to the respective outputs of an 8-bit comparator 11, the output of which is connected to the input 10 and evaluation circuit 12. The output of the storage unit 8 also constitutes the output 13 where the digital output word of the analog to digital converter 7 is made available for further processing with a defined value of the LSB. The evaluation circuit 12 is supplied not only with the pulse signals (f), (b) and (c) respectively at its inputs 14, 15 and 16, but also, at its input 17, receives the LSB belonging to the digital output word of the analog to digital converter 7.

Figure 2:
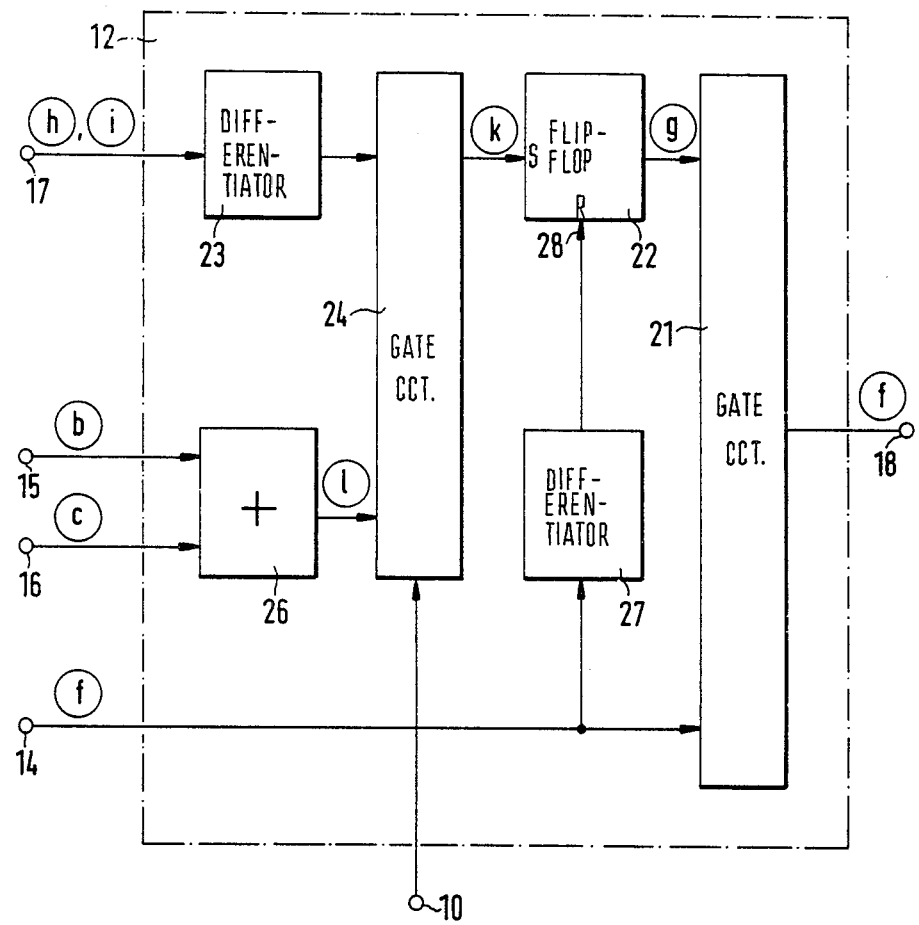
FIG. 2 is a circuit block diagram of the evaluation circuit shown in FIG. 1.

The evaluation circuit 12 of FIG. 1 is shown in more detail in FIG. 2. The pulse signal (f), (see line (f) of FIG. 3) for the clocking of the storage unit 8 is applied to the circuit 12 by way of its input terminal 14 to a gate circuit 21 which can be closed by means of a blocking pulse (g) (see line (g) of FIG. 3) coming from a RS flipflop 22. The blocking of the gate circuit 21 will always be effective when a value of the LSB changing back and forth (see line (h) or line (i) of FIG. 3) is present at the input terminal 17. The pulse flanks of these value changes are differentiated in a differentiating stage 23 and supplied to one input of the set pulse gate circuit 24. At the output of this gate circuit 24, a set pulse (k) then appears if at the same time at the other input of the gate circuit 24, a pulse signal (l) is present which is derived from the pulse signals (b) and (c) by means of an AND gate 26.

When a set pulse (k) is applied to the set input of the RS flipflop 22, a blocking pulse (g) is made available at its output which blocks the gate circuit 21 so that no clock pulse can be provided at the output 18.

The trailing edge of the clock pulse signal (f) is differentiated in a differentiating stage 27, which delivers its output to the reset input 28 of the flipflop 22 for resetting the same. The switchover signal generated by the comparator 11 is also supplied over the terminal 10 to the set pulse gate circuit 24. The signal generated by the comparator 11 blocks the gate circuit 24 when the digital value supplied to the comparator 11 are different more than one bit, resulting in making available at the output 18 the clock signal (f).

As already explained above, the LSB present at the input terminal 17 of the evaluation circuit 12 can briefly take on different values (see for example line (h) or line (i) of FIG. 3) according to whether the analog voltage is in a midregion between two quantization step levels (n) and (n+1) or lies close to one of the quantization step levels. If, for example, the voltage d1, made up of the analog voltage with the superimposed rectangular a.c. voltage, lies in the midregion between the quantization levels n and n+1, there is no change of the value of the LSB in the time interval of the three start pulses, since during this time the analog value for the analog to digital converter remains the same. There is accordingly no pulse signal at the terminal 17.

As soon as some change of the analog dc voltage causes the rectangular ac voltage to cross a threshold n or n+1, a new value of the LSB will be provided by the analog to digital converter 7 after the lapse of the conversion time $t_W$. When the voltage drops from above to below the threshold n, the signal (h) is derived from the signal d2, the leading flank of which is offset in time by the converter time $t_W$. The generation of this signal is produced by the application of the first start pulse of the signal (e). When the second start pulse appears, the input voltage d2 jumps back up above the threshold n, so that the value of the LSB is set back. When the third start pulse appears the original value of the analog voltage d2 is again present and there is no further change of the LSB. In the same way a change value of the LSB is produced in the signal (i). The combination d3 of analog and superimposed rectangular ac voltage signals, crosses and exceeds the converter threshold n+1, so that after the conversion period $t_W$ a new value of the LSB is produced in the signal (i).

These signals (h) or (i) applied to the input 17 of the evaluation circuit 12 have the effect, as above described, to produce blocking of the clock pulse (f) at the output 18 of the circuit 12, so that the storage unit 8 is made unable to take up the new and disturbed digital word, and instead supplies at its output 13 the word previously stored.

With rapid changes of the input signal of the analog to digital converter 7, it could occur that on account of the evaluation circuit 12 not all of the converted words can be taken into the storage unit 8. The 8-bit comparator 11 serves to prevent that. The digital words are always stored in the storage units 8 and 9 after the lapse of the conversion time and then compared with each other in the comparator 11, Thus, by the clocking of the storage unit 9 by means of the start pulses (e) and of the storage unit 8 by means of the clock pulses (f), two values are compared which are actually successive in time. Hence, during the time interval of the start pulses (e) the new value stored in the storage unit 9 is compared with the old value stored in the storage unit 8. When these values are different by less than two bits, i.e., for substantially constant input analog voltage, a signal is produced by the comparator 11 which holds the gate circuit 24 open. If the values in the storage units 8 and 9 differ from each other by more than one bit, however, then a signal for blocking the gate circuit 24 is supplied by the comparator 11, so that the pulse (f) will be allowed to proceed to the output 18.

In summary it can be said that a pulse signal (f) will always be provided to the storage unit 8 when a change of more than one bit between the values of two successive samplings has been found. Whenever a change of less than two bits between the values of two successive samplings is found, the clock pulse signal (f) is supplied only when the analog signal does not lie in the critical region of the quantization steps.

In the use of the method of the invention for blending (interfading) video signals, the blending voltage corresponding to the analog voltage is sampled and converted during the vertical blanking interval of the composite television signal. In the case of a quick change of the analog voltage by a rapid blending over of the video signals, the digitized blending voltage will be delivered by the storage unit 8 at its output 13, thus without any carrying out of an evaluation of the position of the analog voltage with reference to the quantization steps.

Although the invention has been described with reference to a particular illustrative example, it will be understood that variations and modifications are possible within the inventive concept.

I claim:

1. Method of converting noise-affected, slowly varying analog voltage value into a digital signal with a defined value by means of an analog to digital (A/D) converter having quantization step intervals of at least a predetermined minimum voltage value, wherein a rectangular alternating voltage having an amplitude no greater than about half said minimum quantization interval value is superimposed on said analog voltage value, and further comprising the steps of:

generating start pulses (e) for said A/D converter which occur briefly after said A/D converter is clocked to produce a new signal sample in digital form;

generating an intermittent alternating rectangular wave (d) of an amplitude, between its upper and lower voltage levels, not greater than about half said minimum quantization voltage interval value and in which, between successive full alternation cycles of said wave beginning and ending at a voltage midway between said upper and lower voltage levels, there is an interval in which the voltage of said rectangular wave is said voltage midway between said upper and lower voltage levels, the voltage transitions of said wave being timed in fixed timing relation to at least some of said start pulses so as to facilitate identification of first, second and third start pulses in each of a multiplicity of non-overlapping sets of three start pulses by reference to at least approximately contemporaneous first, second and third kinds of voltage transitions of said rectangular wave;

superimposing said rectangular wave additively on said slowly varying analog voltage value to produce a wobbled voltage and applying said wobbled voltage as an input voltage to said A/D converter;

storing the value of the output of said A/D converter existing at the time of a first said start pulse;

detecting, while said A/D converter digitizes its said input voltage following said start pulses, whether a new value of output of said A/D converter is produced during a predetermined portion of the interval ($t_z$) following said first start pulse and extending to shortly before the start pulse which follows the third start pulse of the set of three start pulses to which said first start pulse belongs;

in the event no new value of output of said A/D converter is detected in said interval portion, then at the time of the next start pulse (f) storing and also further transmitting the current A/D converter output value for further processing and, in the event a new value of output of said A/D converter was detected in said interval portion, then at the time of the next start pulse (f) blocking the further transmission of said new output value and transmitting instead for further processing the A/D converter output value which was stored at the time of said first start pulse.

2. Method according to claim 1, wherein said interval portion is an interval between two successive start pulses of said set of three start pulses.

3. Method according to claim 2, wherein said interval portion is the interval between the end of a said second start pulse and the beginning of the following third start pulse of said set.

4. Method according to claim 1, wherein the step of detecting whether a new value of output of said A/D converter is produced is performed by detecting whether the least significant bit of the output of said A/D converter has changed during said interval portion, 5. Method according to claim 1 wherein the step of storing the value of output of said A/D converter existing at the time of a first said start pulse is performed by storage of said value in an output register (8) the contents of which remain stored and unchanged during all operations of said A/D converter until the steps of detecting whether the new value of output of said converter is produced has been completed and may remain stored longer in the event a new value of output of said A/D converter was thereby detected, and wherein the detection step is performed by storing separately each value of output of said A/D converter produced by digitizing the input thereof following each of said first, second and third start pulses and comparing them if the output value stored in said output register followed evaluating the comparison results in said predetermined interval portion, whereby a change output value is stored in said output register and furnished for further processing only when the current output of said A/D converter only when the compared output values move up or down in two steps or more.

6. Method according to claim 1 wherein said slowly varying analog voltage value is a blending voltage signal for transitional blending of video signals and said analog voltage value is stored preliminarily in a sample in hold circuit prior to undergoing the step of having a rectangular wave additively superimposed thereon and the conversion of said analog voltage value to a digital signal is carried on only during the vertical blanking interval of a television signal.

7. Method according to claim 6, wherein a detecting step is not performed and the current A/D converter output value is stored anew and transmitted at every start pulse and said blending voltage signal changes at a rate faster than a predetermined reference rate.

8. Apparatus for converting a noise-affected, slowly varying voltage value into a digital signal with a defined value comprising:

a preliminary sample and hold circuit for intermittently sampling said noise-affected, slowly varying voltage value and storing the same during intervals between sampling, and connected to make stored voltage values available at an output of said and hold circuit;

a summing circuit having a first input connected to said output of said sample and hold circuit and having an output;

an analog-to-digital (A/D) converter having an analog signal input connected to said output of said summing circuit and having a digital signal output at which a digital signal produced by said converter remains available until it is replaced by another digital signal produced by said converter;

pulse generating and supplying means for generating conversion start (e) and digital sampling pulses for said A/D converter and additional rectangular pulses of longer cycle periods than said start and sampling pulses, said additional pulses including pulses for supply to at least one additional input of said summing circuit for superimposing on said analog signal an intermittent rectangular oscillation voltage (d) successively modifying analog signal by signal level changes in opposite directions, said changes having a combined amplitude of about half the smallest quantization step voltage of said analog to digital voltage, said oscillation voltage (d) having three distinguishably different transitions per oscillation which are concurrent in time respectively with three successive start pulses generated by said pulse generator;

first digital signal storage means (8) having an output and having signal and control inputs for storing the signal which is present at said output of said A/D converter at the time of an output forwarding pulse (f) when and if a said forwarding pulse is allowed to pass from said pulse generating means to said control means of said first digital storage means;

second digital signal storage means (9) having an output and having signal and control inputs for storing the signal which is present at said output of said A/D converter at the time a said start pulse is produced by said pulse generating means, a start pulse output of said pulse generating means being connected to said control input of said second digital signal storage means;

digital comparator means (11) for comparing the respective outputs of said first (8) and second (9) digital signal storage means and producing a gate control signal when said respective storage means outputs differ from each other in two steps or more;

a first gating means (24,25) for detecting a change of least significant bit (LSB) output in the output of said A/D converter and producing a decision signal (k), said first gating means having a control input for said gate control signal connected to the output of said comparator means, a first input connected to said pulse generating means for supplying said rectangular wave oscillation to said gating means and a second input connected through a differentiator circuit (23) to receive the LSB output portion of the output of said A/D converter, and an output for providing said decision signal (k) when a change in said LSB output is found to occur during the second portion of a said rectangular voltage oscillation between the second and third voltage transitions thereof, and second gating means (21,27,28) responsive to said output forwarding pulses (f) produced by said pulse generating means and to said decision pulses (k) produced by said first gating means (24) for preventing a said output forwarding pulse from being supplied to the control input of said first digital storage means (8) when said forwarding pulse (f) coincides with a said decision pulse (k) or is the first forwarding pulse (f) to follow a said decision pulse (k).

9. Apparatus according to claim 9 wherein said second gating means includes a gate circuit (21) having an input connected to said pulse generating means for receiving said forwarding pulses, a set-reset flipflop (20) interposed between the output of said first gating means (24,25) and an input of said gate circuit (21), said flipflop having a set input connected to said output of said first gating means and having also a reset input, and differentiating means connected for differentiating said output forwarding pulses to produce reset pulses for said flipflop (20).

* * * * *